United States Patent
Li et al.

(10) Patent No.: US 12,166,153 B2
(45) Date of Patent: Dec. 10, 2024

(54) LIGHT-EMITTING DEVICE WITH POLARIZATION MODULATED LAST QUANTUM BARRIER

(71) Applicant: KING ABDULLAH UNIVERSITY OF SCIENCE AND TECHNOLOGY, Thuwal (SA)

(72) Inventors: Xiaohang Li, Thuwal (SA); Zhiyuan Liu, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 404 days.

(21) Appl. No.: 17/775,042

(22) PCT Filed: Nov. 16, 2020

(86) PCT No.: PCT/IB2020/060785
§ 371 (c)(1),
(2) Date: May 6, 2022

(87) PCT Pub. No.: WO2021/099921
PCT Pub. Date: May 27, 2021

(65) Prior Publication Data
US 2022/0399476 A1    Dec. 15, 2022

Related U.S. Application Data

(60) Provisional application No. 62/937,427, filed on Nov. 19, 2019.

(51) Int. Cl.
*H01L 33/32* (2010.01)
*H01L 33/00* (2010.01)
*H01L 33/06* (2010.01)

(52) U.S. Cl.
CPC .......... *H01L 33/32* (2013.01); *H01L 33/0075* (2013.01); *H01L 33/06* (2013.01)

(58) Field of Classification Search
CPC ..... H01L 33/32; H01L 33/0075; H01L 33/06; H01L 29/15
See application file for complete search history.

(56) References Cited

U.S. PATENT DOCUMENTS

| 2010/0309943 A1 | 12/2010 | Chakraborty et al. |
| 2012/0132887 A1* | 5/2012 | Kim ........................ H01L 33/04 257/13 |
| 2015/0280056 A1 | 10/2015 | Northrup et al. |

FOREIGN PATENT DOCUMENTS

| CN | 103633218 A | 3/2014 |
| CN | 103887385 B | 8/2016 |

OTHER PUBLICATIONS

Chen, et al., "Improved the AlGaN-Based Ultraviolet LEDs Performance with Super-Lattice Structure Last Barrier," IEEE Photonics Journal, Aug. 2018, vol. 10, No. 4, Article No. 8201007, pp. 1-7, IEEE.

(Continued)

*Primary Examiner* — Wasiul Haider
(74) *Attorney, Agent, or Firm* — PATENT PORTFOLIO BUILDERS PLLC

(57) ABSTRACT

A light-emitting device includes doped layer arranged on a substrate. The doped layer is n-doped or p-doped. A multiple quantum well is arranged on the doped layer and includes a plurality of adjacent pairs of quantum wells and quantum barriers. An electron blocking layer is arranged on the multiple quantum well. The doped layer, the electron blocking layer, the quantum wells, and all of the quantum barriers except for the last quantum barrier include a first III-nitride alloy. The last quantum barrier includes a second III-nitride alloy that is different from the first III-nitride alloy. The (Continued)

second III-nitride alloy has a bandgap larger than a bandgap of the last quantum well and smaller than a bandgap of the electron blocking layer. An interface between the last quantum barrier and the electron blocking layer exhibits a polarization difference between 0 and 0.012 $C/m^2$.

20 Claims, 5 Drawing Sheets

(56) References Cited

OTHER PUBLICATIONS

International Search Report in corresponding/related International Application No. PCT/IB2020/060785, date of mailing Mar. 5, 2021.
Ji, X., et al., ., "Efficiency Improvement by Polarization-Reversed Electron Blocking Structure in GaN-Based Light-Emitting Diodes," Optics Express, May 5, 2014, vol. 22, No. 9, pp. A1001-A1008, Optical Society of America.
Kim, H.J., et al., "Improvement of Quantum Efficiency by Employing Active-Layer-Friendly Lattice-Matched InAlN Electron Blocking Layer in Green Light-Emitting Diodes," Applied Physics Letters, Mar. 8, 2010, vol. 96, No. 10, Article No. 101102, American Institute of Physics.
Kim, M.-H., et al., "Origin of Efficiency Droop in GaN-Based Light-Emitting Diodes," Applied Physics Letters, Oct. 30, 2007, vol. 91, pp. 183507-1-183507-3, AIP Publishing LLC.
Kuo, Y.-K., et al., "Numerical Simulation of Blue InGaN Light-Emitting Diodes with Polarization-Matched AlGaInN Electron-Blocking Layer and Barrier Layer," Optics Communications, Jul. 17, 2009, vol. 282, No. 21, pp. 4252-4255, Elsevier B.V.
Lin, Z., et al., "Achieving High-Performance Blue GaN-Based Light-Emitting Diodes by Energy Band Modification on $Al_xIn_yGa_{1-x-y}N$ Electron Blocking Layer," IEEE Transactions on Electron Devices, Feb. 2017, vol. 64, No. 2, pp. 472-480, IEEE Xplore.
Written Opinion of the International Searching Authority in corresponding/related International Application No. PCT/IB2020/060785, date of mailing Mar. 5, 2021.
Zhang, Z.-H., et al., "Increasing the Hole Energy by Grading the Alloy Composition of the P-Type Electron Blocking Layer for Very High-Performance Deep Ultraviolet Light-Emitting Diodes," Photonics Research, Apr. 2019, vol. 4, No. 4, pp. B1-B6.

\* cited by examiner

LIGHT-EMITTING DEVICE WITH POLARIZATION MODULATED LAST QUANTUM BARRIER

CROSS-REFERENCE TO RELATED APPLICATIONS

This application is a U.S. National Stage Application of International Application No. PCT/IB2020/060785, filed Nov. 16, 2020, which claims priority to U.S. Provisional Patent Application No. 62/937,427, filed on Nov. 19, 2019, entitled "POLARIZATION-MATCHED In AIN LAST QUANTUM BARRIER FOR UV LED," the disclosures of which are incorporated herein by reference in their entirety.

BACKGROUND

Technical Field

Embodiments of the disclosed subject matter generally relate to light-emitting devices in which the alloy and composition of the last quantum barrier is modulated to adjust the polarization difference at the interface of the last quantum barrier and the electron blocking layer.

Discussion of the Background

III-nitride ultraviolet light-emitting diodes (UV LEDs) have undergone accelerating development due to the wide range of applications such as UV curing, phototherapy, and sensing. Compared with conventional ultraviolet sources, such as mercury lamps, ultraviolet LEDs are extremely robust, compact, environmentally-friendly, and long-lasting. However, ultraviolet LEDs still suffer from various problems, including low internal quantum efficiency (IQE) due to efficiency droop, Shockley-Read-Hall (SRH) recombination, severe electron leakage, and poor hole injection, etc.

In III-nitride LED structures, the positive polarization charges could exist at the interface between the last quantum barrier (LQB) and the wider-bandgap electron blocking layer (EBL) because of the negative heterointerface polarization difference ($\Delta P$). These positive charges can bend the bands of the last quantum barrier, resulting in a lower effective electron barrier and higher effective hole barrier. Therefore, the electron blocking and hole injection will be seriously compromised, ultimately contributing to poorer optical power and efficiency.

Two main methods have been proposed to address the issues with positive polarization charges at the heterointerface. One method adopts more complex last quantum barrier or electron blocking layer structures to eliminate the band bending induced by the polarization charges. For example, in connection with AlGaN-based LEDs, Reference [1] discloses using a superlattice last quantum barrier and Reference [2] discloses composition grading the electron blocking layer.

The other main method is to design different heterojunctions utilizing polarization engineering. For instance, References [3] and [4] disclose designing the electron blocking layer using lattice-matched InAlN and polarization-matched AlInGaN in InGaN-based LEDs. However, the improvement by the latticed-matched InAlN electron blocking layer without piezoelectric polarization is limited because the positive charges still exist at the interface of the last quantum barrier and the electron blocking layer due to spontaneous polarization. Additionally, growing a quaternary alloy and precisely controlling its composition for the polarization-matched AlInGaN electron blocking layer is still challenging. References [5] and [6] numerically and experimentally disclose that a AlInGaN polarization-reversed electron blocking layer having negative polarization charges localizing at the interface of last quantum barrier and the electron blocking layer could enhance electron-blocking effectiveness if the design is appropriate. Again, growing a quaternary alloy (i.e., AlInGaN) and precisely controlling its composition is challenging.

Thus, it would be desirable to provide a light-emitting device that addresses the polarization issues existing at the interface of the last quantum barrier and the electron blocking layer without introducing complexity into these two layers and without requiring complex growth techniques for quaternary alloys.

SUMMARY

According to an embodiment, there is light-emitting device, which includes doped layer arranged on a substrate. The doped layer is n-doped or p-doped. A multiple quantum well is arranged on the doped layer and includes a plurality of adjacent pairs of quantum wells and quantum barriers. An electron blocking layer is arranged on the multiple quantum well. A quantum barrier, of the multiple quantum well, closest to the electron blocking layer is a last quantum barrier and a quantum well, of the multiple quantum well, closest to the electron blocking layer is a last quantum well. The doped layer, the electron blocking layer, the quantum wells, and all of the quantum barriers except for the last quantum barrier include a first III-nitride alloy. The last quantum barrier includes a second III-nitride alloy that is different from the first III-nitride alloy. The second III-nitride alloy has a bandgap larger than a bandgap of the last quantum well and smaller than a bandgap of the electron blocking layer. An interface between the last quantum barrier and the electron blocking layer exhibits a polarization difference between 0 and 0.012 C/m$^2$.

According to another embodiment, there is a method for forming a light-emitting device. A doped layer is formed on a substrate. The doped layer is n-doped or p-doped. A multiple quantum well, comprising a plurality of adjacent pairs of quantum wells and quantum barriers, is formed on the doped layer. An electron blocking layer is formed on the multiple quantum well. A quantum barrier, of the multiple quantum well, closest to the electron blocking layer is a last quantum barrier and a quantum well, of the multiple quantum well, closest to the electron blocking layer is a last quantum well. The doped layer, the electron blocking layer, the quantum wells, and all of the quantum barriers except for the last quantum barrier comprise a first III-nitride alloy. The last quantum barrier comprises a second III-nitride alloy that is different from the first III-nitride alloy. The second III-nitride alloy has a bandgap larger than a bandgap of the last quantum well and smaller than a bandgap of the electron blocking layer. An interface between the last quantum barrier and the electron blocking layer exhibits a polarization difference between 0 and 0.012 C/m$^2$.

According to a further embodiment, there is a method for forming a light-emitting device comprising a multiple quantum well having a plurality of adjacent pairs of quantum wells and quantum barriers, wherein the formed light-emitting device includes an electron blocking layer formed on the multiple quantum well and a quantum well, of the plurality of quantum wells, closest to the electron blocking layer is a last quantum well and a quantum barrier, of the plurality of quantum barriers, closest to the electron blocking layer is a last quantum barrier. The method involves determining a first III-nitride alloy for doped layer, the quantum wells, the electron blocking layer, and all of the quantum barriers except for the last quantum barrier. The first III-nitride alloy is determined based on an output wavelength of the light-emitting device. The doped layer is n-doped or p-doped. Compositions of the first III-nitride alloy for the doped layer, the quantum wells, the electron blocking layer, and all of the quantum barriers except for the last quantum barrier are determined. A second III-nitride alloy, which is different from the first III-nitride alloy, is determined for the last quantum barrier. A composition of the second III-nitride alloy is determined for the last quantum barrier. Whether the selected composition of the second III-nitride alloy for the last quantum barrier satisfies first and second conditions is determined. The first condition being that the last quantum barrier has a bandgap larger than the last quantum well and a smaller bandgap than the electron blocking layer and the second condition is that a polarization difference at an interface between the last quantum barrier and the electron blocking layer is between 0 and 0.012 C/m². When the determined composition of the second III-nitride alloy for the last quantum barrier satisfies the first and second conditions, the light-emitting device is formed using the determined first III-nitride alloy and compositions of the first III-nitride alloy and the determined second III-nitride alloy and the composition of the selected III-nitride alloy.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of III-nitrides.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
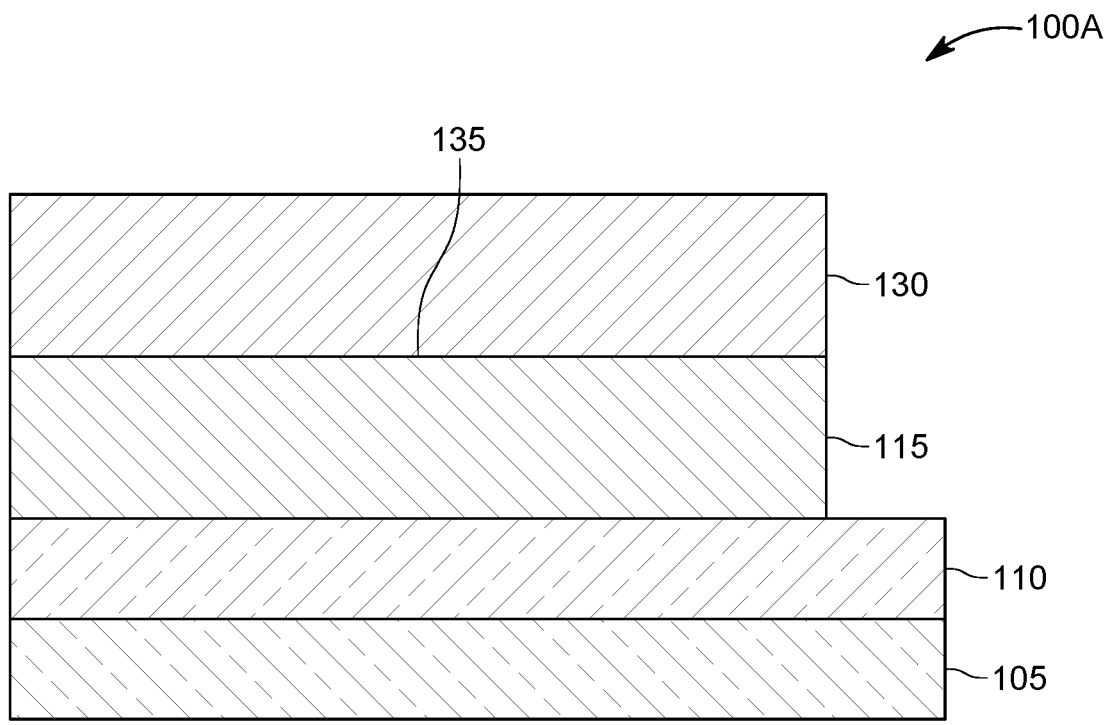
FIG. 1A is a block diagram of a light-emitting device according to embodiments.
Figure 1B:
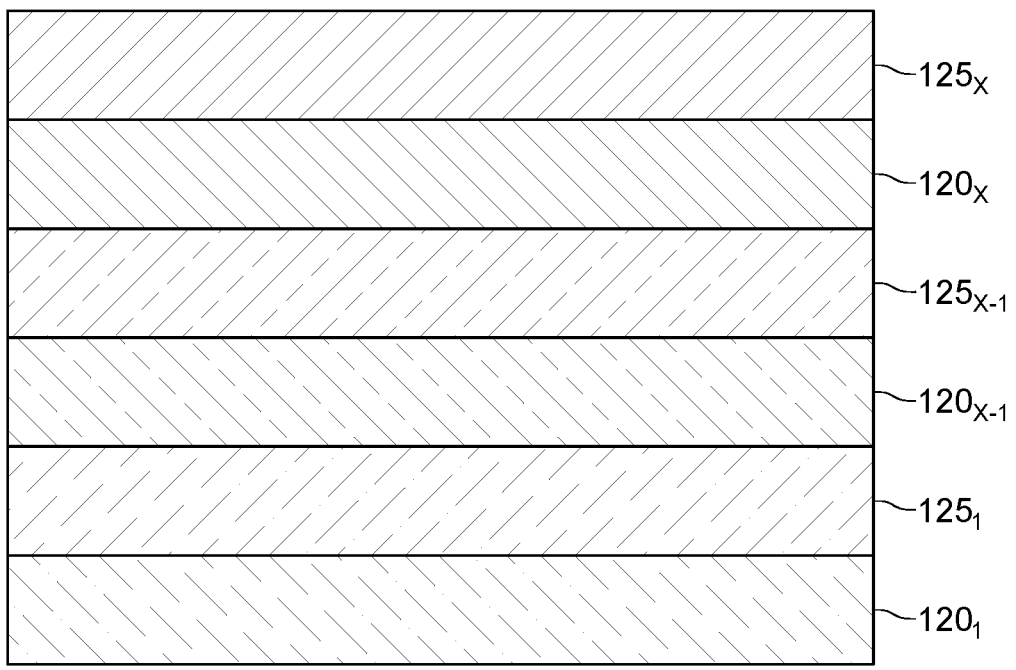
FIG. 1B is a block diagram of a multiple quantum well of a light-emitting device according to embodiments.

FIGS. 1A and 1B respectively illustrate a light-emitting device and a multiple quantum well of the light-emitting device according to embodiments. The light-emitting device 100A includes a doped layer 110 arranged on a substrate 105. The doped layer 110 can be n-doped or p-doped. The substrate 105 can be a bulk substrate, such as an AlN substrate, or can be a template layer on a foreign substrate, such as an AlN template on a sapphire substrate. Thus, references to a substrate should be understood as referring to a bulk substrate or a template layer. A multiple quantum well 115 is arranged on the doped layer 110. As illustrated in FIG. 1B, the multiple quantum well 115 comprises a plurality of adjacent pairs of quantum wells $120_1$-$120_x$ and quantum barriers $125_1$-$125_x$. An electron blocking layer 130 is arranged on the multiple quantum well 115. A quantum barrier $125_x$, of the multiple quantum well 115, closest to the electron blocking layer 130 is a last quantum barrier $125_x$. A quantum well $120_x$, of the multiple quantum well 115, closest to the electron blocking layer 130 is a last quantum well $120_x$. The doped layer 110, the electron blocking layer 130, the quantum wells 120, and all of the quantum barriers $125_1$-$125_{x-1}$ except for the last quantum barrier $125_x$ comprise a first III-nitride alloy. The last quantum barrier $125_x$ comprises a second III-nitride alloy that is different from the first III-nitride alloy. The second III-nitride alloy has a bandgap larger than a bandgap of the last quantum well $120_x$ and smaller than a bandgap of the electron blocking layer 130. An interface 135 between the last quantum barrier $125_x$ and the electron blocking layer 130 exhibits a polarization difference between 0 and 0.012 C/m². The interface 135 exhibits a polarization difference between 0 and 0.012 C/m² due to the differences between the first and second III-nitride alloys and the compositions of these alloys, and this polarization difference improves electron confinement and hole injection, which improves the overall optical performance of the light-emitting device compared to light-emitting devices in which the last quantum barrier and the electron blocking layer are comprised of the same III-nitride alloy.

Figure 1C:
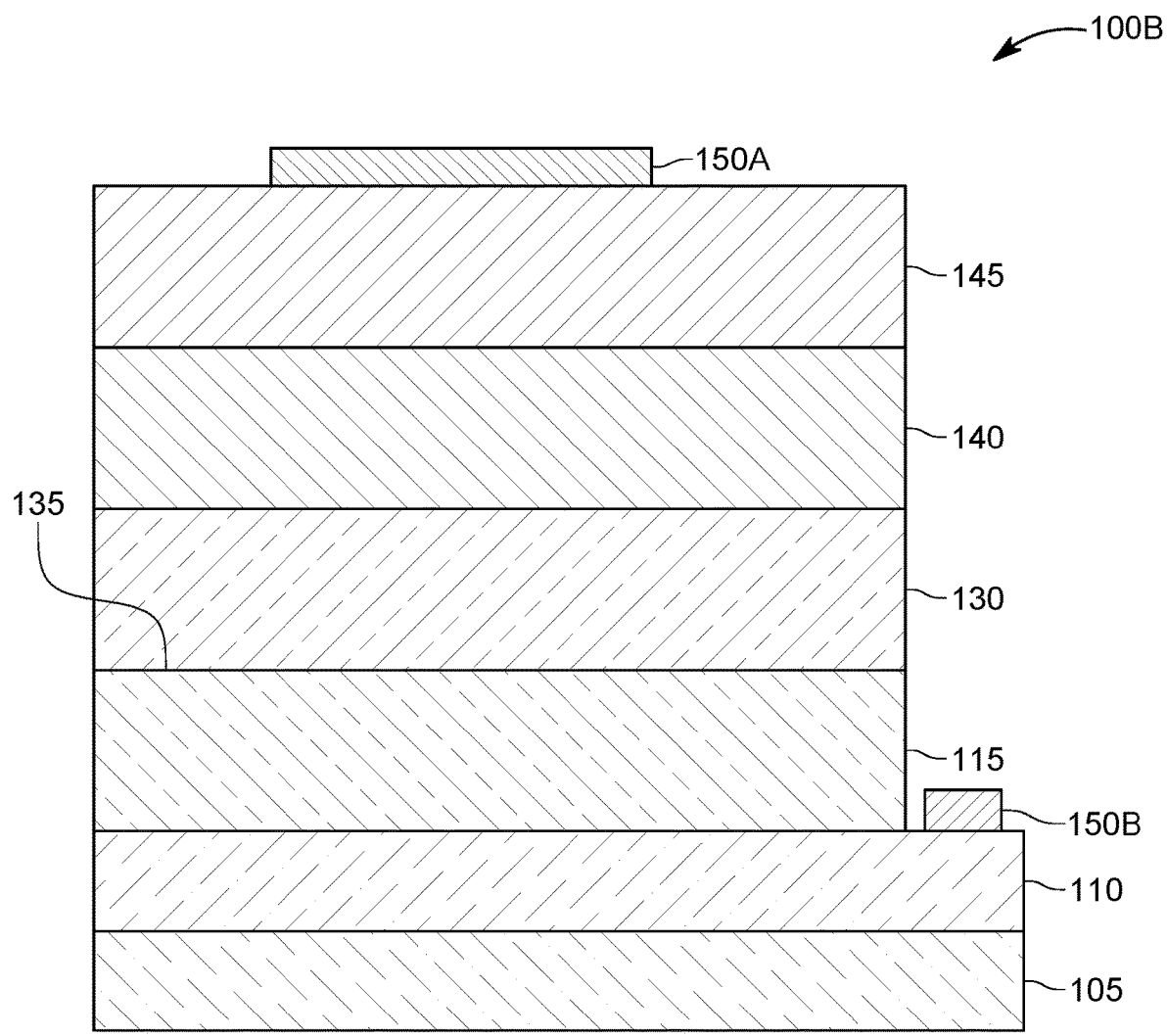
FIG. 1C is a block diagram of a light-emitting device according to embodiments.

Turning now to FIG. 1C and assuming doped layer 110 is n-doped, the light-emitting device 100B can further include a p-doped a hole injection layer 140 arranged on the electron blocking layer 130, which improves the injection of holes into the multiple quantum well 115. The device 100B can further include a contact layer 145 arranged on the hole injection layer 140 and first 150A and second 150B contacts. Assuming that doped layer 110 is a p-doped layer, then layer 140 will be an n-doped layer and the contact layer 145 and contact 150A would be arranged on the bottom side of the substrate 105. Thus, it will be appreciated that whichever type of doping is present in doped layer 110, the layer 140 will have the opposite type of doping.

Figure 2:
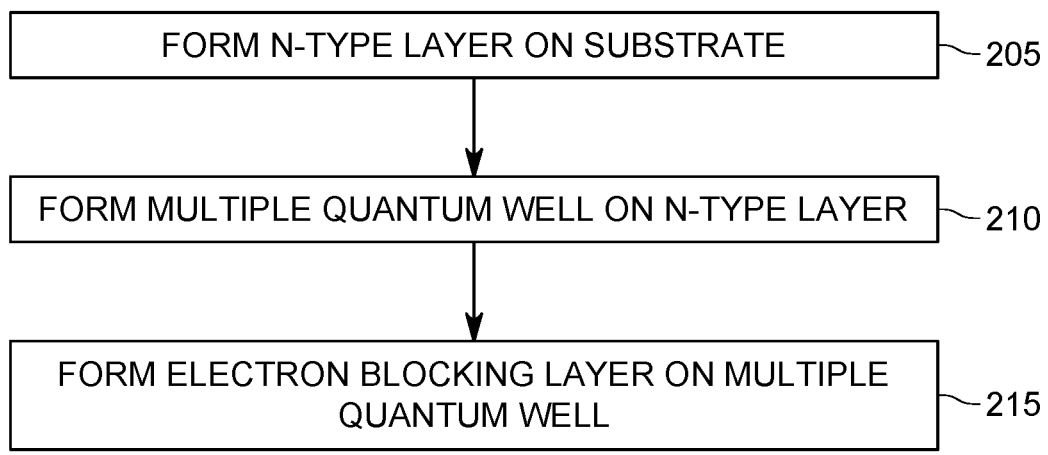
FIG. 2 is a flowchart of a method for forming a light-emitting device according to embodiments.

A method for forming a light-emitting device 100A or 100B is illustrated in the flowchart of FIG. 2. Initially, doped layer 110 is formed on a substrate 105 (step 205), where the doped layer 110 is n-doped or p-doped. A multiple quantum well 115, comprising a plurality of adjacent pairs of quantum wells $120_1$-$120_x$ and quantum barriers $125_1$-$125_x$, is formed on the doped layer 110 (step 210). An electron blocking layer 130 is formed on the multiple quantum well 115 (step 215). A quantum barrier $125_x$, of the multiple quantum well 115, closest to the electron blocking layer 130 is a last quantum barrier $125_x$. A quantum well $120_x$, of the multiple quantum well 115, closest to the electron blocking layer 130 is a last quantum well $120_x$. The doped layer 110, the electron blocking layer 130, the quantum wells $120_1$-$120_x$, and all of the quantum barriers $125_1$-$125_{x-1}$ except for the last quantum barrier $125_x$ comprise a first III-nitride alloy. The last quantum barrier $125_x$ comprises a second III-nitride alloy that is different from the first III-nitride alloy. The second III-nitride alloy has a bandgap larger than a bandgap of the last quantum well $120_x$ and smaller than a bandgap of the electron blocking layer $130$. An interface $135$ between the last quantum barrier $125_x$ and the electron blocking layer $130$ exhibits a polarization difference between 0 and 0.012 $C/m^2$. The light-emitting device can be formed using any conventional process, including metal-organic chemical vapor deposition (MOCVD), pulsed laser deposition (PLD), chemical solution deposition (CSD), or molecular-beam epitaxy (MBE).

As noted above, the interface $135$ exhibiting a polarization difference between 0 and 0.012 $C/m^2$ is due to the differences between the first and second III-nitride alloys and the compositions of these alloys. A non-limiting example of a light-emitting device exhibiting this polarization difference will now be described and compared to a light-emitting device that employs the same III-nitride alloys in the last quantum barrier and the electron blocking layer. It should be recognized, however, that those skilled in the art are familiar with how to determine the polarization difference at the interface between two III-nitride layers, and thus can easily employ different III-nitride alloys than those discussed in the following non-limiting example.

In the non-limiting example, the substrate $105$ is an AlN template, the doped layer $110$ is a n-$Al_{0.3}Ga_{0.7}N$ layer that is 3 μm thick that is doped with Si of $5\times10^{18}/cm^3$, the electron blocking layer $130$ is a p-$Al_{0.5}Ga_{0.5}N$ layer that is 20 nm thick and doped with Mg of $5\times10^{18}/cm^3$, the hole injection layer $140$ is a p-$Al_{0.3}Ga_{0.7}N$ layer that is 100 nm thick and doped with Mg doping of them are $3\times10^{19}/cm^3$, and the contact layer $145$ is a p-GaN layer that is 50 nm thick with Mg doping concentration of $1\times10^{20}/cm^3$.

In order to evaluate the improvement of the disclosed light-emitting device $100A$ or $100B$, five different compositions of the multiple quantum well $115$ were initially considered. All five compositions included six pairs of quantum wells and quantum barriers, all of the quantum wells $120_1$-$120_x$ were $Al_{0.2}Ga_{0.8}N$ quantum wells that were 3 nm thick, and all of the quantum barriers $125_1$-$125_{x-1}$, except for the last quantum barrier $125_x$, were n-$Al_{0.3}Ga_{0.7}N$ quantum barriers that were 12 nm thick and doped with $5\times10^{17}/cm^3$ n-type doping, which can involve Si doping or another type of doping. Table 1 lists the different compositions of the last quantum barrier $125_x$, all of which were 12 nm thick.

TABLE 1

| Example | Last Quantum Barrier $125_x$ Composition |
|---|---|
| A | $Al_{0.3}Ga_{0.7}N$ |
| B | $In_{0.16}Al_{0.84}N$ |
| C | $In_{0.15}Al_{0.85}N$ |
| D | $In_{0.14}Al_{0.86}N$ |
| E | $In_{0.18}Al_{0.82}N$ |

The last quantum barrier $125_x$ in each of the examples was not doped because doping this layer reduces the effective electron barrier and increases electron leakage. Thus, example A represents a conventional light-emitting device in which the last quantum barrier $125_x$ and the electron blocking layer $130$ comprise the same III-nitride alloy, i.e., AlGaN, whereas examples B-E are directed to the disclosed light-emitting devices $100A$ and $100B$ in which different III-nitride alloys are used for the last quantum barrier $125_x$ and the electron blocking layer $130$.

APSYS software by Crosslight was employed to self-consistently solve various physical equations including drift-diffusion equations, Schrodinger and Poisson's equations, current continuity equations, etc. with proper boundary conditions. The bandgap bowing parameters (b) of the $In_xAl_{1-x}N$ alloys (0<x<1) were extracted from theoretical and experimental studies shown in Equation (1). The electron affinity of the $In_xAl_{1-x}N$ alloys (0<x<1) and the bandgaps of AlN, GaN and InN were obtained from publicly-available sources.

$$b = 20.15356\exp\left(\frac{-x}{0.04012}\right) + 12.82116\exp\left(\frac{x}{0.23357}\right) + 3.64629 \quad (1)$$

The band offset ratio of AlGaN was set to be 0.65/0.35. The Shockley-Read-Hall (SRH) recombination lifetime and the Auger recombination coefficient were chosen as 50 ns and $1.0\times10^{-30}/cm^3$, respectively, because of the low Al content in quantum wells. A polarization factor of 0.6 was set because the interface charge density obtained from experiment is usually smaller than theoretical value due to the screening of defects and injected carriers. The operating temperature and background loss were separately estimated to be 300 K and 2000 $m^{-1}$, respectively. The activation energy of GaN and AlGaN was assumed to be 170 meV and 270 meV. It was also assumed that the 3 μm n-$Al_{0.3}Ga_{0.7}N$ layer was fully relaxed on the AlN template and other layers are fully strained on the n-layer.

The total polarization of each layer at the interface of the last quantum barrier $125_x$ and the electron blocking layer $130$ can be calculated using equation (2) and the polarization difference at the interface $135$ can be calculated using (3):

$$P_{total} = P_{sp} + P_{pz} = P_{sp} + 2\left(e_{31} - P_{sp} - \frac{c_{13}}{c_{33}}e_{33}\right)\frac{a_{sub} - a_{epi}}{a_{epi}} \quad (2)$$

$$\Delta P_{Layer2/Layer1} = P_{Layer2} - P_{Layer1} \quad (3)$$

Table 2 lists the parameters used for calculating polarization for the first and second III-nitride alloys used in the non-limiting example.

TABLE 2

|  | $Al_xGa_{1-x}N$ (0 ≤ x ≤ 1) | $In_xAl_{1-x}N$ (0 ≤ x ≤ 1) |
|---|---|---|
| a(Å) | $0.01589x^2 - 0.08416x + 3.812$ | $0.05298x^2 + 0.37398x + 3.109$ |
| $P_{sp}$ ($C/m^2$) | $0.0072x^2 - 0.0127x + 1.3389$ | $0.1563x^2 - 0.3323x + 1.3402$ |
| $e_{33}$ ($C/m^2$) | $0.3949x^2 + 0.6324x + 0.6149$ | $0.9329x^2 - 1.5036x + 1.6443$ |
| $e_{31}$ ($C/m^2$) | $-0.0573x^2 - 0.2536x - 0.3582$ | $-0.0959x^2 - 0.239x - 0.6699$ |
| $C_{13}$ (GPa) | $112x + 104(1 - x)$ | $88x + 112(1 - x)$ |
| $C_{33}$ (GPa) | $383x + 376(1 - x)$ | $233x + 383(1 - x)$ |

Using the data in Table 2 and formulas (2) and (3), the polarization difference at the interface $135$ of the last quantum barrier $125_x$ and the electron blocking layer $130$ were calculated for each example A-E, which are reflected in Table 3. Table 3 also includes the known bandgaps for each of these materials.

TABLE 3

| Device ID | LQB | ΔP of LQB/EBL (C/m$^2$) | Bandgap (eV) |
|---|---|---|---|
| A | $Al_{0.3}Ga_{0.3}N$ | −0.0168 | 4.058 |
| B | $In_{0.16}Al_{0.84}N$ | 0.0061 | 3.882 |
| C | $In_{0.15}Al_{0.85}N$ | 0.0090 | 3.980 |
| D | $In_{0.14}Al_{0.86}N$ | 0.0119 | 4.041 |
| E | $In_{0.18}Al_{0.82}N$ | 0.0003 | 3.716 |

The values in Table 3 are theoretical values and, due to the screening of defects and injected carriers, the interface charge density obtained from experiments will usually be smaller than the theoretical value. Indeed, different experiments can result in different values for the interface charge density even when using the same reference structure. With respect to the screening effects, if the theoretical value of the polarization difference is 0.1 and the polarization factor is 0.6, the real polarization difference will be 0.06. Although this discussion involves theoretical values, both theoretical and experimental values provide the same trend in device performance.

Although Device E had the smallest polarization difference ΔP at the interface 135 between $In_{0.18}Al_{0.82}N$ and $Al_{0.5}Ga_{0.5}N$ layers, this device was not further studied because its bandgap of 3.716 eV was smaller than the bandgap of 3.830 eV for the last quantum well $120_x$, and accordingly the last quantum barrier $125_x$ of Device E could be absorptive. The detailed analysis below therefore addresses Devices A-D. The bowing parameter of the AlGaN bandgap was set according to publicly-available data and other used parameters were based on the default value in APSYS. It should be noted that Device A has a negative polarization difference, which is detrimental to the performance of the light-emitting device, whereas Devices B-D have a positive polarization difference, which increases performance of the light-emitting device.

The band diagrams of Devices A and B were calculated and the results showed that due to the positive heterointerface polarization charges, the conduction and valence bands of the last quantum barrier $125_x$ near the electron blocking layer 130 of Device A bent down and up significantly, resulting in 290.2 and 357.1 meV effective barrier heights for electrons and holes, respectively. The limited effective electron barrier indicated that electrons could move over the barrier leading to considerable electron overflow; and the large effective hole barrier could pose major challenges for holes to inject into the active region. For Device B, the ΔP of $In_{0.16}Al_{0.84}N/Al_{0.5}Ga_{0.5}N$ was positive and lower compared with Device A and only a few negative polarization charges localized at the heterointerface 135. Thus, the direction of band bending in last quantum barrier $125_x$ of Device B was opposite to Device A and the bands near the electron blocking layer 130 are much flatter. Thus, Device B exhibited a higher barrier for electrons and lower barrier for holes, about 589.7 meV and 285.0 meV, respectively.

To reveal the distribution of electrons and holes of Device A and B, the carrier concentration across the active region was calculated. The calculation indicated an electron peak in the last quantum barrier $125_x$ of Device A, which is consistent with the electrostatic field profile and band bending effects at the interface 135 of the last quantum barrier $125_x$ and the electron blocking layer 130. For Device B, the overall carrier concentration in the multiple quantum wells $120_1$-$120_x$ was slightly larger than in Device A because the polarization modulation (i.e., the change in the polarization difference at interface 135 by changing the III-nitride alloy of the last quantum barrier $125_x$) induced higher electron barrier and lower barrier for holes. It was observed for Device B that a hole peak exists in last quantum barrier $125_x$ due to the bending downward valence band and the electron concentration in last quantum well $120_x$ was quite high because of the larger ΔP between the last quantum well $120_x$ and the last quantum barrier $125_x$. The electrons still maintained a certain-level concentration in last quantum barrier $125_x$, which may generate extra recombination with holes.

With respect to Devices C and D, it was observed that there were still an electron and a hole peak in the last quantum well $120_x$ and last quantum barrier $125_x$, respectively. However, in Devices C and D, due to the larger positive ΔP at the interface of the last quantum barrier $125_x$ and the electron blocking layer 130 as well as the larger ΔP between the last quantum barrier $125_x$ and the last quantum well $120_x$ compared with Device B, the conduction and valence band in the last quantum barrier $125_x$ in Devices C and D sharply bent upward and downward, respectively, causing less carrier concentration between the electron and hole concentration peaks. Therefore, there would be less or no recombination in the last quantum barriers $125_x$ having the alloy and compositions of $In_{0.15}Al_{0.85}N$ and $In_{0.14}Al_{0.86}N$ and the carrier concentration in the multiple quantum wells $120_1$-$120_x$ was higher. The electron barrier heights for Device C (568.7 meV) and Device D (547.0 meV) were lower than the Device B (575 meV), but the hole barrier (244.4 meV and 214.0 meV) in electron blocking layer 130 was lower. Although there are higher hole barriers in the last quantum barriers $125_x$ having the alloy and compositions of $In_{0.15}Al_{0.85}N$ and $In_{0.14}Al_{0.86}N$ (337.3 meV and 416.0 meV), the blocking of holes was limited because the width of last quantum barrier $125_x$ was narrower than the electron blocking layer 130. And numerically, they are still competitive compared with the hole barrier height in Device A.

The radiative recombination rate of Devices A-D were also investigated. Device A had the lowest radiative recombination rate and the average rate in MQWs is about $1.9 \times 10^{26}$ cm$^{-3}$/s. Inversely, the average rate of Device D was the highest ($3.6 \times 10^{26}$ cm$^{-3}$/s) because of more carriers in the multiple quantum wells $120_1$-$120_x$, which were over two times than those of Device A. As for Device B and Device C, the high-level carrier concentration in last quantum well $120_x$ and the last quantum barrier $125_x$ produced little recombination because the distance between the peaks of electron and hole was about 12 nm (i.e., the width of the last quantum barrier $125_x$) and only a part of carriers between the two peaks could generate recombination effectively. It also caused worse average radiative recombination rate in the multiple quantum wells $120_1$-$120_x$ ($1.9 \times 10^{26}$ cm$^{-3}$/s and $3.5 \times 10^{26}$ cm$^{-3}$/s) of Devices B and C compared to Device D. Devices C and D had higher spontaneous emission rate and no obvious wavelength shift was observed. These results are completely consistent with analysis of the band diagram and carrier concentration above, and it is believed that the better performance of the light-emitting devices 100A or 100B having a last quantum barrier $125_x$ with the alloys and compositions of $In_{0.15}Al_{0.85}N$ and $In_{0.14}Al_{0.86}N$ due to the better hole injection and less carrier accumulation and recombination in the last quantum barrier $125_x$.

The I-V characteristic of Devices A-D were also evaluated. The evaluation indicated that better electron confinement and hole injection contribute to lower operation voltage at the same current in Devices B-D, which would result in a light-emitting device having lower power consumption. It is worth noting that in comparison with Device B, the operation voltage is larger in Device C and Device D because of lower effective electron barrier in EBLs 130 and higher hole injection barrier in the last quantum barriers 125$_x$ of these devices.

The internal quantum efficiency, optical output power, and wall plug efficiency (WPE) of Devices A-D were also evaluated, the results of which are shown in Table 4. The light extraction efficiency used to calculate the WPE was set to 10%.

TABLE 4

|  | Device A | Device B | Device C | Device D |
|---|---|---|---|---|
| Output power (mW) | 92.5 | 161.1 | 172.4 | 173.7 |
| WPE | 3.76% | 6.84% | 7.50% | 7.49% |

Figure 3:
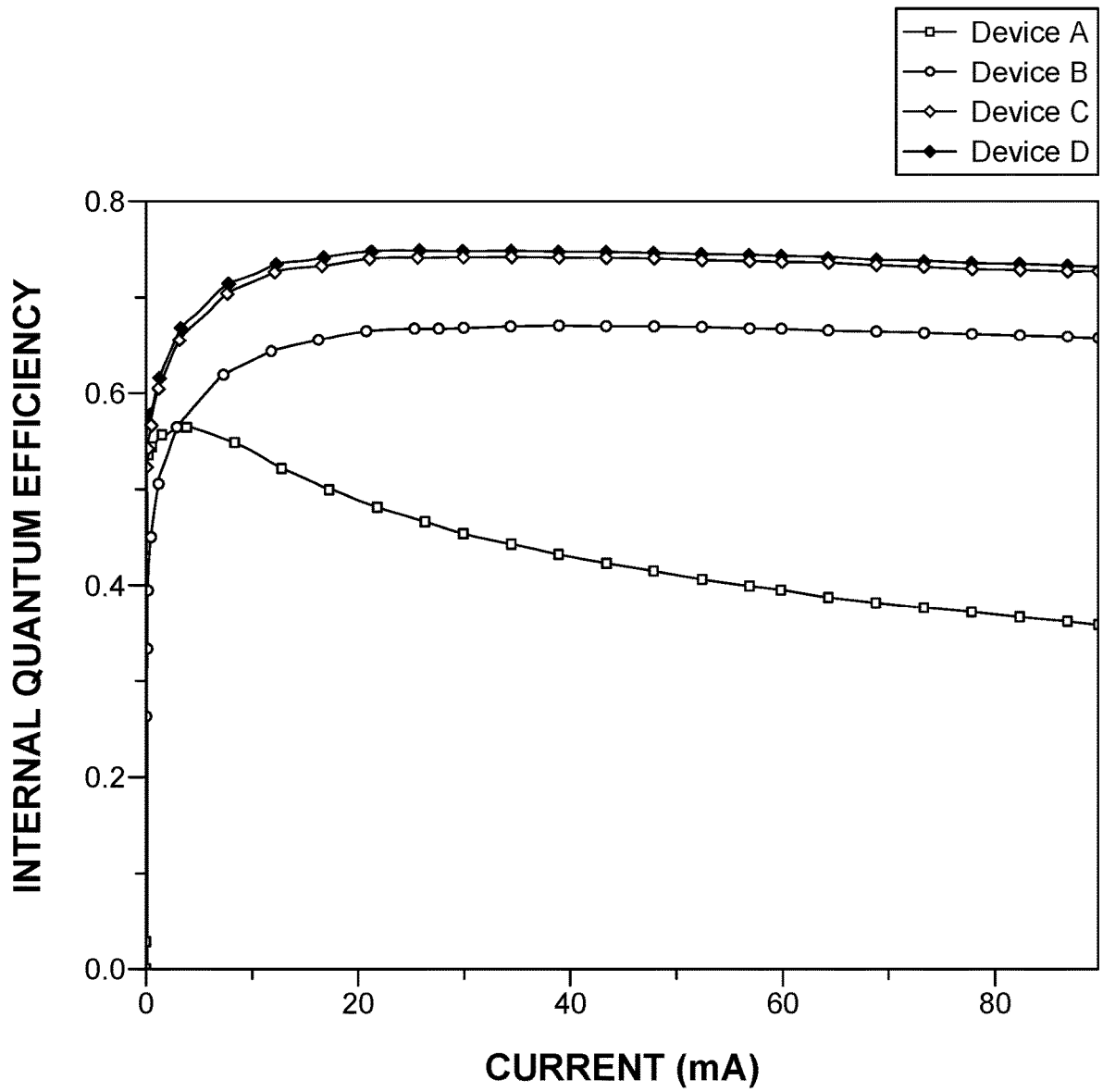
FIG. 3 is a graph of the internal quantum efficiency of a number of light-emitting devices according to embodiments.

FIG. 3 is a graph of the internal quantum efficiency for Devices A-D. As illustrated in FIG. 3, Devices B-D had higher internal quantum efficiency and less droop compared with Device A. A light-emitting device having a last quantum barrier 125$_x$ with the alloy and composition of $In_{0.14}Al_{0.86}N$ (Device D) demonstrated the best performance among all the structures due to better carrier transportation and more effective recombination in the multiple quantum wells 120$_1$-120$_x$. The peak internal quantum efficiency of Device D reached approximately 76%. The output power of Device D showed similar results. Unlike the internal quantum efficiency and the output power, the wall plug efficiency of Device C was slightly higher than Device D in the calculations due to the lower operation voltage. For other InAlN-based last quantum barriers with lower indium composition, such as $In_{0.13}Al_{0.87}N$ and $In_{0.12}Al_{0.88}N$, the reduced amount of indium did little to further reduce the accumulation and recombination of carrier in last quantum barrier 125$_x$. Further, the lower indium concentration would contribute to more serious blocking for holes because of a higher hole barrier in the last quantum barrier 125$_x$ induced by the larger polarization between the last quantum barrier 125$_x$ and the last quantum well 120$_x$, ultimately leading to higher operation voltage and poorer wall plug efficiency. Thus, it was concluded that Devices B-D had much better performance compared with the conventional structure of Device A, and furthermore, Devices C and D (having last quantum barriers 125$_x$ comprising InAlN with 0.14 and 0.15 indium composition) were more suitable to replace the conventional AlGaN last quantum barrier 125$_x$ (Device A) in a 320 nm ultraviolet light-emitting diode. Besides, the InAlN/AlGaN heterojunction with similar relationship between ΔP and bandgap difference can be obtained with higher aluminum content. Thus, this method also can be applied to light-emitting diodes in other ultraviolet regions.

Figure 4:
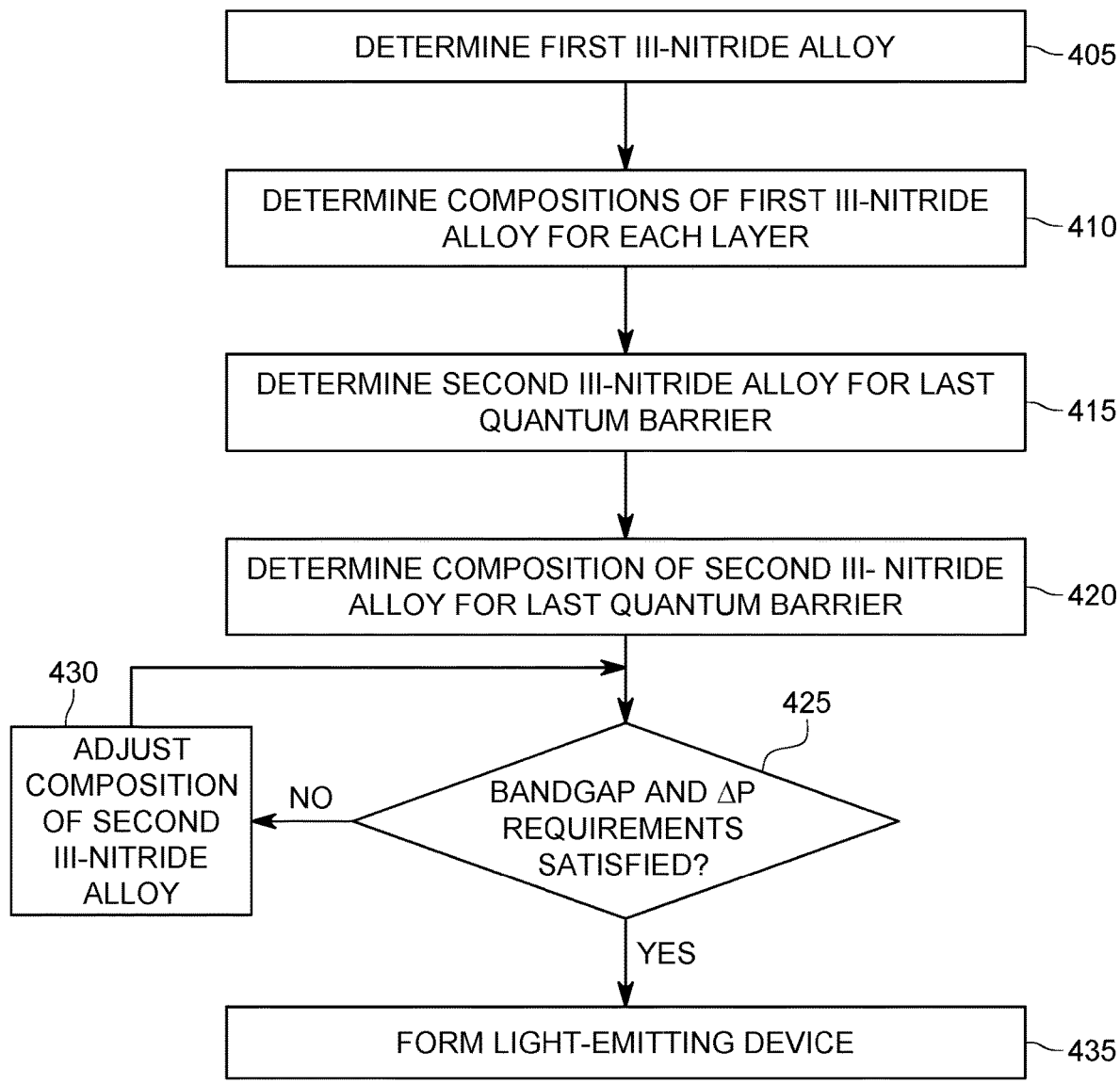
FIG. 4 is a flowchart for polarization modulation of the last quantum barrier for a light-emitting device according to embodiments.

As will be appreciated from the non-limiting example above, using different III-nitride alloys for the last quantum barrier and the electron blocking layer and then adjusting the composition of the III-nitride alloy for the last quantum barrier to achieve a desired polarization difference at the interface of the last quantum barrier and the electron blocking layer, as well as the last quantum barrier having a bandgap larger than that of the last quantum well but smaller than the electron blocking layer, can be employed to significantly improve the operation and efficiency of a light-emitting device, such as a light emitting diode or laser diode. This process can be referred to as polarization modulation, and an example of this process is illustrated in the flowchart of FIG. 4.

Initially, a first III-nitride alloy for doped layer 110, the quantum wells 120$_1$-120$_x$, the electron blocking layer 130, and all of the quantum barriers except but the last quantum barrier 125$_x$ are determined (step 405). The doped layer 110 is n-doped or p-doped. The first III-nitride alloy is selected based on an output wavelength of the light-emitting device 100A or 100B. The output wavelength of various III-nitride alloys are well-known and can easily be determined by those skilled in the art.

Next, compositions of the first III-nitride alloy for the doped layer 110, the quantum wells 120$_1$-120$_x$, the electron blocking layer 130, and all of the quantum barriers except but the last quantum barrier 125$_x$ are determined (step 410). The compositions of the III-nitride alloy for the various layers are determined based on a variety of factors, including the polarization difference at the interface between two layers, the lattice mismatch issue between two layers, the desired conduction and valence bands of the layers, and the output wavelength of the device. Specifically, the composition of the quantum wells largely depends on the desired output wavelength because different compositions of the quantum wells have different bandgaps, and different bandgaps correspond to different output wavelengths, whereas the composition of the other layers depends upon the function of the layer. For example, to achieve quantum confinement, the bandgap of the quantum barriers should be larger than the bandgap of the quantum wells. In order to block electrons, the composition of the electron blocking layer 130 should result in the electron blocking layer having a larger bandgap than the quantum wells and quantum barriers. The composition also depends on the lattice mismatch and polarization. Specifically, a higher composition difference between layers increases the lattice mismatch, which can destroy the quality of the layer. Further, a higher composition difference corresponds to a higher polarization difference, which reduced device performance.

A second III-nitride alloy, which is different from the first III-nitride alloy, is determined for the last quantum barrier 125$_x$ (step 415) and a composition of the second III-nitride alloy for the last quantum barrier 125$_x$ is determined (step 420). Next it is determined whether the selected composition of the second III-nitride alloy for the last quantum barrier 125$_x$ satisfies first and second conditions (step 425). The first condition being that the last quantum barrier has a bandgap larger than the last quantum well 120$_x$ and a smaller bandgap than the electron blocking layer 130 and the second condition is that a polarization difference at an interface 135 between the last quantum barrier 125$_x$ and the electron blocking layer 130 is between 0 and 0.012 $C/m^2$.

When the determined composition of the second III-nitride alloy for the last quantum barrier (125$_x$) satisfies the first and second conditions ("Yes" path out of decision step 425), the light emitting device 100A or 100B is formed using the determined first III-nitride alloy and compositions of the first III-nitride alloy and the determined second III-nitride alloy and the composition of the selected III-nitride alloy (step 435). If, however, the first and second conditions are not satisfied ("No" path out of decision step 425), the composition of the second III-nitride alloy is adjusted (step 430) and it is determined whether the adjusted composition satisfies the first and second conditions (step 425). The non-limiting example above outlines how this polarization modulation of the last quantum barrier 125$_x$ can be performed, and those skilled in the art can easily extrapolate that specific example to other III-nitride alloys.

The polarization modulation of the last quantum barrier has been shown to provide better optical performance for light-emitting device by adjusting the composition of a last quantum barrier comprised of a III-nitride alloy that is different from the III-nitride alloy of the electron blocking layer. Specifically, the disclosed polarization modulation can improve electron confinement and hole injection, which provides more effective electron-hole recombination, higher output power, higher internal quantum efficiency, and higher wall-plug efficiency. This improved optical performance is particularly useful in the ultraviolet emission wavelength range.

The discussion above relates to ternary III-nitride alloys, which are much easier to grow and precisely control its composition compared to quaternary III-nitride alloys. It will be recognized by those skilled in the art that a ternary III-nitride alloy may include insignificant concentrations of additional elements, in which case it could be technically considered as a quaternary alloy but would not be referred to as such by those skilled in the art. These insignificant concentrations of additional elements can arise due to contaminants or impurities becoming part of the III-nitride alloy layer(s) during the process of forming the layer(s). These contaminants or impurities typically comprise less than 1.0% of the overall composition of the III-nitride ternary alloy layer. Further, those skilled in the art would also consider a III-nitride alloy as a ternary alloy when, in addition to two group III elements, there is an insubstantial amount of other elements, including other group III elements. Those skilled in the art would consider a concentration of 1.0% or less of an element being an insubstantial amount. Thus, for example, one skilled in the art would consider layers comprising $Al_yIn_{1-x-y}Ga_xN$, where x≤1.0%, as ternary alloys InAlN because they include an insubstantial amount of gallium impurity.

The disclosed embodiments provide light-emitting device having a last quantum barrier polarization modulated based on the composition of the electron blocking layer. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] C. Qian, J. Chen, C. Chen, et al., "Improved the AlGaN-based ultraviolet LEDs performance with superlattice structure last barrier," *IEEE Photon. J.*, vol. 10(4), 2018, Art. no. 8201007.

[2] Z. H. Zhang, J. Kou, S. W. H. Chen, et al., "Increasing the hole energy by grading the alloy composition of the p-type electron blocking layer for very high-performance deep ultraviolet light-emitting diodes," Photon. Res., vol. 7(4), 2019, pp. B1-B6.

[3] H. J. Kim, S. Choi, S. S. Kim, et al., "Improvement of quantum efficiency by employing active-layer-friendly lattice-matched InAlN electron blocking layer in green light-emitting diodes," Appl. Phys. Lett., vol. 96(10), 2010, Art. no. 101102.

[4] Y. K. Kuo, M. C. Tsai and S. H. Yen, "Numerical simulation of blue InGaN light-emitting diodes with polarization-matched AlGaInN electron-blocking layer and barrier layer," Opt. Commun., vol. 282(21), 2009, pp. 4252-4255.

[5] X. L. Ji, T. Wei, F. Yang, et al., "Efficiency improvement by polarization-reversed electron blocking structure in GaN-based Light-emitting diodes," Opt. Exp., vol. 22(9), 2014, pp. A1001-A1008.

[6] Z. Lin, H. Wang, S. Chen, et al., "Achieving High-Performance Blue GaN-Based Light-Emitting Diodes by Energy Band Modification on $Al_xIn_yGa_{1-x-y}N$ Electron Blocking Layer," IEEE Trans. Electron Devices, vol. 64(2), 2007, pp. 472-480.

What is claimed is:

1. A light-emitting device, comprising:
doped layer arranged on a substrate, wherein the doped layer is n-doped or p-doped;
a multiple quantum well arranged on the doped layer and comprising a plurality of adjacent pairs of quantum wells and quantum barriers;
an electron blocking layer arranged on the multiple quantum well, wherein a quantum barrier, of the multiple quantum well, closest to the electron blocking layer is a last quantum barrier and a quantum well, of the multiple quantum well, closest to the electron blocking layer is a last quantum well,
wherein the doped layer, the electron blocking layer, the quantum wells, and all of the quantum barriers except for the last quantum barrier comprise a first III-nitride alloy, and wherein the last quantum barrier comprises a second III-nitride alloy that is different from the first III-nitride alloy,
wherein the second III-nitride alloy has a bandgap larger than a bandgap of the last quantum well and smaller than a bandgap of the electron blocking layer, and
wherein an interface between the last quantum barrier and the electron blocking layer exhibits a polarization difference between 0 and 0.012 C/m².

2. The light-emitting device of claim 1, wherein the doped layer is an n-doped layer, the light-emitting device further comprising:
a hole injection layer arranged on the electron blocking layer, wherein the hole injection layer is comprised of the first III-nitride alloy.

3. The light-emitting device of claim 2, further comprising:
a contact layer arranged on the hole injection layer;
a first contact arranged on the contact layer; and
a second contact arranged on the doped layer.

4. The light-emitting device of claim 1, wherein each of the quantum barriers except for the last quantum barrier is doped.

5. The light-emitting device of claim 1, wherein the first III-nitride alloy is $Al_xGa_{1-x}N$ and the second III-nitride alloy is $In_yA_{1-y}N$.

6. The light-emitting device of claim 5, wherein the electron blocking layer comprises p-$Al_{0.5}Ga_{0.5}N$, the last quantum well comprises $Al_{0.2}Ga_{0.8}N$, and y of the last quantum barrier is between 0.14 and 0.16.

7. The light-emitting device of claim 1, wherein the substrate comprises one group-III metal of the first III-nitride alloy.

8. The light-emitting device of claim 1, wherein the light-emitting device is a light-emitting diode or laser diode.

9. A method for forming a light-emitting device, the method comprising:
   forming a doped layer on a substrate, wherein the doped layer is n-doped or p-doped;
   forming a multiple quantum well, comprising a plurality of adjacent pairs of quantum wells and quantum barriers, on the doped layer;
   forming an electron blocking layer on the multiple quantum well, wherein a quantum barrier, of the multiple quantum well, closest to the electron blocking layer is a last quantum barrier and a quantum well, of the multiple quantum well, closest to the electron blocking layer is a last quantum well,
   wherein the doped layer, the electron blocking layer, the quantum wells, and all of the quantum barriers except for the last quantum barrier comprise a first III-nitride alloy, and wherein the last quantum barrier comprises a second III-nitride alloy that is different from the first III-nitride alloy,
   wherein the second III-nitride alloy has a bandgap larger than a bandgap of the last quantum well and smaller than a bandgap of the electron blocking layer, and
   wherein an interface between the last quantum barrier and the electron blocking layer exhibits a polarization difference between 0 and 0.012 $C/m^2$.

10. The method of claim 9, wherein the doped layer is an n-doped layer, the method further comprising:
    forming a hole injection layer on the electron blocking layer, wherein the hole injection layer is comprised of the first III-nitride alloy.

11. The method of claim 10, further comprising:
    forming a contact layer on the hole injection layer;
    forming a first contact arranged on the contact layer; and
    forming a second contact arranged on the doped layer.

12. The method of claim 9, wherein the formation of each of the quantum barriers except for the last quantum barrier involves doping each of the quantum barriers except for the last quantum barrier.

13. The method of claim 9, wherein the first III-nitride alloy is $Al_xGa_{1-x}N$ and the second III-nitride alloy is $In_yAl_{1-y}N$.

14. The method of claim 13, wherein the electron blocking layer is formed comprising p-$Al_{0.5}Ga_{0.5}N$, and the last quantum barrier is formed so that y is between 0.14 and 0.16.

15. The method of claim 9, wherein formation of the light-emitting device involves metal-organic chemical vapor deposition, MOCVD, pulsed laser deposition, PLD, chemical solution deposition, CSD, or molecular-beam epitaxy, MBE.

16. A method for forming a light-emitting device comprising a multiple quantum well having a plurality of adjacent pairs of quantum wells and quantum barriers, wherein the formed light-emitting device includes an electron blocking layer formed on the multiple quantum well and a quantum well, of the plurality of quantum wells, closest to the electron blocking layer is a last quantum well and a quantum barrier, of the plurality of quantum barriers, closest to the electron blocking layer is a last quantum barrier, is the method comprising:
    determining a first III-nitride alloy for doped layer, the quantum wells, the electron blocking layer, and all of the quantum barriers except for the last quantum barrier, wherein the first III-nitride alloy is determined based on an output wavelength of the light-emitting device, wherein the doped layer is n-doped or p-doped;
    determining compositions of the first III-nitride alloy for the doped layer, the quantum wells, the electron blocking layer, and all of the quantum barriers except for the last quantum barrier;
    determining a second III-nitride alloy, which is different from the first III-nitride alloy, for the last quantum barrier;
    determining a composition of the second III-nitride alloy for the last quantum barrier;
    determining whether the selected composition of the second III-nitride alloy for the last quantum barrier satisfies first and second conditions, the first condition being that the last quantum barrier has a bandgap larger than the last quantum well and a smaller bandgap than the electron blocking layer and the second condition is that a polarization difference at an interface between the last quantum barrier and the electron blocking layer is between 0 and 0.012 $C/m^2$,
    wherein when the determined composition of the second III-nitride alloy for the last quantum barrier satisfies the first and second conditions, forming the light-emitting device using the determined first III-nitride alloy and compositions of the first III-nitride alloy and the determined second III-nitride alloy and the composition of the selected III-nitride alloy.

17. The method of claim 16, wherein the formation of the light-emitting device comprises:
    forming the doped layer on the substrate;
    forming the multiple quantum well on the doped layer;
    forming the electron blocking layer on the multiple quantum well.

18. The method of claim 17, wherein the doped layer is an n-doped layer and wherein the formation of the light-emitting device further comprises:
    forming a hole injection layer on the electron blocking layer, wherein the hole injection layer is comprised of the first III-nitride alloy.

19. The method of claim 18, wherein the formation of the light-emitting deice further comprises:
    forming a contact layer on the hole injection layer;
    forming a first contact arranged on the contact layer; and
    forming a second contact arranged on the doped layer.

20. The method of claim 16, wherein formation of the light-emitting device involves metal-organic chemical vapor deposition, MOCVD, pulsed laser deposition, PLD, chemical solution deposition, CSD, or molecular-beam epitaxy, MBE.

* * * * *